United States Patent [19]

Mroczek et al.

[11] 3,866,312

[45] Feb. 18, 1975

[54] METHOD OF CONTACTING SEMICONDUCTOR REGIONS IN A SEMICONDUCTOR BODY

[75] Inventors: Werner Mroczek, Heilbronn; Werner Scherber, Nordheim, both of Germany

[73] Assignee: Licentia Patent-Verwaltungs-GmbH, Frankfurt am Main, Germany

[22] Filed: Nov. 30, 1971

[21] Appl. No.: 203,389

[30] Foreign Application Priority Data

Dec. 1, 1970 Germany ........................... 2058931

[52] U.S. Cl. ........... 29/578, 117/93.1 GD, 117/212, 117/217, 148/174, 148/189, 29/590

[51] Int. Cl. ............................................. H01l 7/64

[58] Field of Search. 117/212, 217, 106 R, 107.2 R, 117/93.3, 106.7, 229, 93.1 GD; 148/175, 174, 189; 317/234; 204/129.3, 192; 29/591, 578, 580, 571, 630 R, 630 A, 629

[56] References Cited

UNITED STATES PATENTS

| | | | |
|---|---|---|---|
| 3,237,271 | 1/1966 | Arnold et al. | 317/234 |
| 3,419,761 | 12/1968 | Pennebaker | 29/578 |
| 3,457,631 | 7/1969 | Hall et al. | 29/580 |
| 3,466,191 | 9/1969 | Stinchfield et al. | 117/93.1 |
| 3,485,666 | 12/1969 | Sterling et al. | 117/93.1 |
| 3,507,766 | 4/1970 | Cunningham et al. | 117/93.1 |
| 3,520,722 | 7/1970 | Scott | 117/106 |
| 3,551,196 | 12/1970 | Herczog et al. | 117/217 |
| 3,573,096 | 3/1971 | Tombs | 117/106 |
| 3,631,305 | 12/1971 | Bhatt et al. | 117/217 |
| 3,783,046 | 1/1974 | Myers | 29/578 |

*Primary Examiner*—Charles E. Van Horn
*Assistant Examiner*—J. W. Massie
*Attorney, Agent, or Firm*—Spencer & Kaye

[57] ABSTRACT

A method of contacting internested semiconductor regions in a semiconductor body comprises removing, from the surface of the semiconductor body at which the semiconductor regions are formed, an insulating layer formed thereon, during the production of the regions, at least sufficiently to expose substantially the entire surface of the semiconductor regions, applying a coherent metal layer to the surface of the semiconductor body over the regions, making electrodes for the regions from the coherent metal layer, and depositing a further insulating layer on to the surface of the semiconductor body through which layer electrical contact is made with the electrodes.

18 Claims, 11 Drawing Figures

METHOD OF CONTACTING SEMICONDUCTOR REGIONS IN A SEMICONDUCTOR BODY

BACKGROUND OF THE INVENTION

The invention relates to a method for contacting internested semiconductor regions formed at one surface of a semiconductor body by means of the diffusion masking method.

SUMMARY OF THE INVENTION

According to the invention, there is provided a method of contacting internested semiconductor regions formed at one surface of a semiconductor body by means of a diffusion masking method ending with the formation of an insulating layer over said one surface of said semiconductor body, said method comprising the steps of removing said insulating layer from said one surface of said semiconductor body at least sufficiently to expose substantially the entire surface of said semiconductor regions, applying a coherent metal layer to said one surface of said semiconductor body, forming electrodes contacting said semiconductor regions from said coherent metal layer, depositing a further insulating layer on said one surface of said semiconductor body and making electrically conducting connections with said electrodes through said further insulating layer.

Further according to the invention, there is provided a method of making a transistor comprising the steps of diffusing internested base and emitter regions into a semiconductor body having the conductivity of a collector region so as to lie at one surface of said semiconductor body, removing a first insulating layer formed during the diffusion process from said one surface of said semiconductor body at least from said base and emitter regions up to adjacent the outermost edge of said base region, applying a coherent metal layer to said one surface of said semiconductor body, making base and emitter electrodes from said coherent metal layer, applying a second insulating layer to said one surface of said semiconductor body, and making electrically conducting connections with said base and emitter electrode through said second insulating layer by means of electrical leads.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
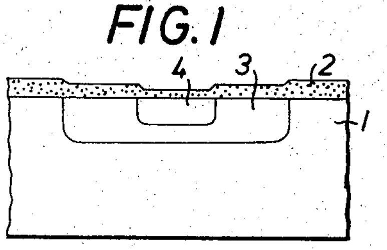
FIG. 1 is a sectional view of a semiconductor body showing an initial stage of one example of the method of the invention.

In a method of contacting internested semiconductor regions formed at one surface of a semiconductor body by means of the diffusion masking method, the invention proposes that after the diffusing of the semiconductor regions, the insulating layer is removed at least from the surface of the internested semiconductor regions, a coherent metal layer is then applied to this surface and the electrodes for contacting the internested semiconductor regions are made from this metal layer, a second insulating layer is formed on this surface, and an electrically conducting connection is made with the electrodes through this second insulating layer. The invention is used to advantage for semiconductor arrangements such as diodes, transistors, or arrangements with even more internested semiconductor regions, and for integrated circuits. Such arrangements are manufactured, for example, by planar processes, and are formed as planar devices with even surfaces.

The invention has the advantage that only a single masking and etching stage is necessary after the diffusion. According to the hitherto used method, contacting windows must be additionally masked and etched. In addition, the high edges in openings of the first insulating layer are avoided which may result in faults during the varnishing and etching. Together with the first insulating layer, all impurities are also removed at least from partial zones of the surface, which impurities may have entered during the high termperature treatment (diffusion, oxidation, and tempering). The bare semiconductor surface can be cleaned very efficiently. The second insulating layer can be very pure. No high temperature steps are necessary later. This eliminates instabilities in the semiconductor element caused by ion drift in the insulating layer.

The first insulating layer, serving during the diffusion as a diffusion mask, is removed after the diffusion, either from the whole 0 entire face of the semiconductor body, or only from the surface of the internested, diffused semiconductor regions. For example, in a transistor the outermost of the internested and diffused semiconductor regions is the base region, whilst the other or inner of the internested semiconductor regions produced by diffusion is the emitter region.

preferably, the second insulating layer is made of silicon nitride. Preferably, the layer of silicon nitride is produced in the glow discharge of $SiH_4$ and $N_2$. These two gases can be manufactured to a very high degree of purity. Other nitride layers (pyrolytic or sputtered) are based on gaseous $NH_3$ or solid $Si_3N_4$, i.e., substances which are not available at such purity. The deposition of the silicon nitride layer takes place, for example, at a temperature of 350° C. Prior to the deposition of the silicon nitride layer, the semiconductor base equipped with electrodes or conductor paths is preferably cleaned by a glow discharge. This glow discharge cleaning is carried out, for example, in an oxygen or an inert gasatmosphere. It is recommended to carry out this glow discharge cleaning in the same apparatus as the deposition of the silicon nitride layer. The first insulating layer may consist, for example, of silicon dioxide or also of silicon nitride.

According to the invention, the subsequent mounting of leads (e.g. lead wires) to the electrodes or to conductor paths may be carried out by penetrating the second insulating layer by thermal compression or by ultrasonic. It is also possible to open the second insulating layer prior to mounting the leads by back-sputtering as required.

Referring now to the drawings, the manufacture of a planar transistor according to the invention may be based on a semiconductor body with the conductivity of the collector region, into one surface of which semiconductor body, consisting, e.g., of silicon, the base and emitter regions are formed by diffusion masking. FIG. 1 shows the planar transistor in this manufacturing stage, the collector body of the planar transistor being shown at 1, the first insulating layer acting as diffusion mask and provided on one surface of the semiconductor at 2, the diffused base region at 3, and the emitter region at 4. The insulating layer consists in this case of silicon dioxide.

Figure 2:
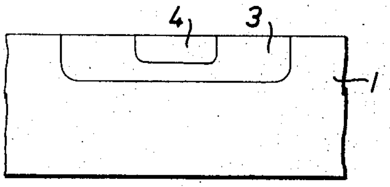
FIG. 2 is a sectional view of a semiconductor body similar to FIG. 1 but showing a second stage of the method.
Figure 3:
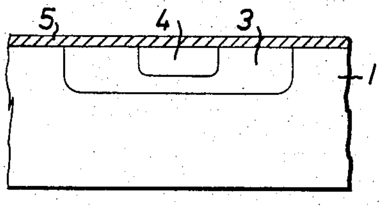
FIG. 3 is a sectional view of a semiconductor body similar to FIG. 1 but showing a third stage of the method.

After the diffusion of the base region 3 and of the emitter region 4, the whole of the first insulating layer 2 is removed from the semiconductor surface, as shown in FIG. 2, and is replaced, according to FIG. 3, by a coherent metal layer 5, applied to the exposed semiconductor surface, for example by evaporation. If the evaporation is carried out without masking, the metal layer 5 according to FIG. 3 covers the whole surface of the semiconductor body 1 on the side containing the emitter region 4.

Figure 4:
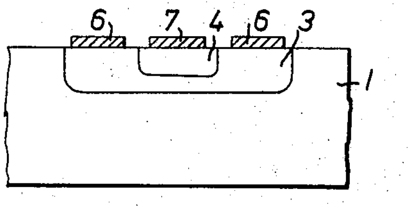
FIG. 4 is a sectional view of a semiconductor body similar to FIG. 1 but showing a fourth stage of the method.
Figure 5:
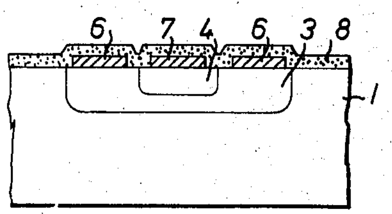
FIG. 5 is a sectional view of a semiconductor body similar to FIG. 1 but showing a fifth stage of the method.

Then, as shown in FIG. 4, the base electrode 6 and the emitter electrode 7 are formed from the metal layer 5. This may be achieved, for example, by structured etching, using the photo-lacquer method. After the manufacture of the base and emitter electrodes 6 and 7, the surface of the semiconductor body 1 at which the emitter region was formed is again covered with an insulating layer, namely with a second insulating layer 8, as shown in FIG. 5. According to the invention, this insulating layer 8 may consist of silicon nitride, produced according to the invention, for example, by glow discharge from $SiH_4$ and $N_2$. This treatment may take place, for example, at a temperature of 350° C. Prior to the deposition of the silicon nitride layer, a glow discharge cleaning is preferably carried out, advantageously in the same apparatus in which the silicon nitride layer is deposited. Preferably, the glow discharge cleaning is effected in an oxygen or inert gas environment.

Figure 6:
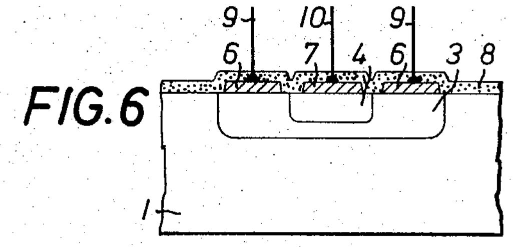
FIG. 6 is a sectional view of a semiconductor body similar to FIG. 1 but showing a final stage of the method.

According to FIG. 6, the electrodes 6 and 7 are contacted by leads 9 and 10 being pushed through the second insulating layer 8, and are thereby connected to the electrodes 6 and 7. The perforation may be effected, for example, by using ultra-sonic methods.

Figure 7:
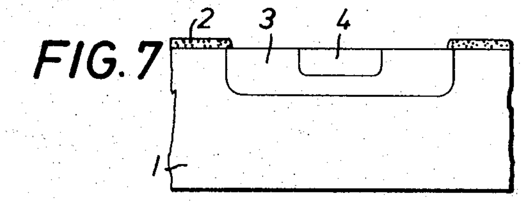
FIG. 7 is a sectional view of a semiconductor body similar to FIG. 2 but showing the second stage of a second example of the method of the invention.

The embodiment of FIGS. 7 to 11 differs from the embodiment of FIGS. 1 to 6 only by the fact that the first insulating layer 2 is not completely removed from the semiconductor surface of the planar transistor after the production of the base and emitter regions by diffusion, but is left partially on the semiconductor surface, as shown in FIG. 7. In the second embodiment, the first insulating layer 2 is removed by removing the insulating layer 2 from the surface of the emitter region 4 completely, and from the surface of the base region 3 only to such an extent that the insulating layer 2 remains only on the edge of the base region, i.e., on the edge of the outermost of the internested semiconductor regions produced by diffusion. In this manner, the collector-base-p-n junction is also protected by the first insulating layer 2.

Figure 8:
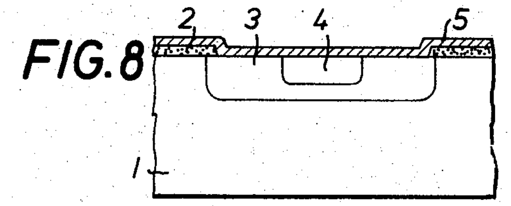
FIG. 8 is a sectional view of a semiconductor body similar to FIG. 7 but showing the third stage of the method
Figure 9:
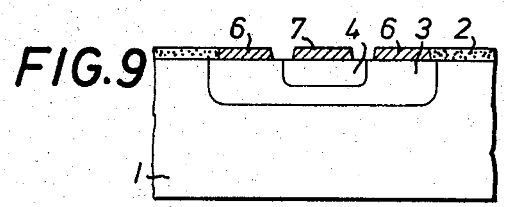
FIG. 9 is a sectional view of a semiconductor body similar to FIG. 7 but showing the fourth stage of the method.
Figure 10:
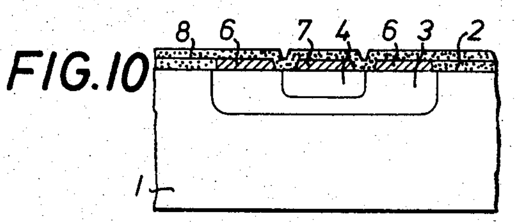
FIG. 10 is a sectional view of a semiconductor body similar to FIG. 7 but showing the fifth stage of the method.
Figure 11:
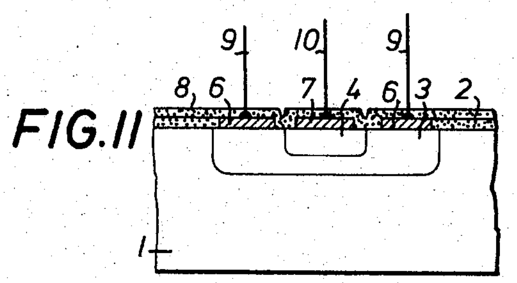
FIG. 11 is a sectional view of a semiconductor body similar to FIG. 7 but showing a final stage of the second example of the method of the invention.

According to FIG. 8, the metal layer 5 is again applied without a mask, both on the exposed surface of the semiconductor and on the remaining part of the first insulating layer 2. FIG. 9 shows again the manufacture of the base electrode 6 and of the emitter electrode 7, whilst in the arrangement of FIG. 10 the second insulating layer 8 has been provided and in the arrangement of FIG. 11, the electrodes 6 and 7 are equipped through the insulating layer 8 with feed wires 9 and 10 for the base and emitter electrodes.

It will be understood that the above description of the present invention is susceptible to various modifications, changes and adaptations.

What is claimed is:

1. A method of contacting internested semiconductor regions formed at one surface of a semiconductor body by means of a diffusion masking method ending with the formation of an insulating layer over said one surface of said semiconductor body, said method comprising the steps of: removing a continuous portion of said insulating layer from said one surface of said semiconductor body at least sufficiently to expose substantially the entire surface of said internested semiconductor regions applying a coherent metal layer directly to at least the exposed portion of said one surface of said semiconductor body to cover same; forming electrodes respectively contacting said semiconductor regions from said coherent metal layer; depositing a further insulating layer on said one surface of said semiconductor body; and making electrically conducting connections with said electrodes through said further insulating layer.

2. A method as defined in claim 1, and comprising making said electrically conducting connections by connecting electrode leads to said electrodes through said further insulating layer.

3. A method as defined in claim 1, and comprising removing said insulating layer formed during formation of said semiconductor regions from the whole of said one surface of said semiconductor body.

4. A method as defined in claim 1, and comprising removing said insulating layer formed during formation of said semiconductor regions only from the surface of said semiconductor regions up to adjacent the outer edge of the outermost of said semiconductor regions.

5. A method as defined in claim 1 and comprising depositing, as said further insulating layer, a layer of silicon nitride on said one surface of said semiconductor body.

6. A method as defined in claim 5, wherein said layer of silicon nitride is deposited in the glow discharge from $SiH_4$ and $N_2$.

7. A method as defined in claim 6, wherein said silicon nitride layer is deposited at a temperature of about 350° C.

8. A method as defined in claim 5, further comprising glow discharge cleaning said one surface of said semiconductor body prior to deposition of said silicon nitride layer.

9. A method as defined in claim 8, wherein said glow discharge cleaning is carried out in an oxygen atmosphere.

10. A method as defined in claim 8, wherein said glow discharge cleaning is carried out in an inert gas atmosphere.

11. A method as defined in claim 8, and comprising carrying out said glow discharge cleaning in the same apparatus in which the said silicon nitride layer is deposited.

12. A method as defined in claim 1, further comprising penetrating said further insulating layer by thermal compression for making said electrically conducting connections with said electrodes.

13. A method as defined in claim 1, further comprising penetrating said further insulating layer by ultrasonic for making said electrically conducting connections with said electrodes.

14. A method as defined in claim 1, further comprising forming contact making windows in said further insulating layer by back-sputtering for making said electrically conducting connections with said electrodes.

15. A method as defined in claim 1, wherein said insulating layer formed during the formation of said semiconductor regions comprises silicon dioxide.

16. A method as defined in claim 1, wherein said insulating layer formed during the formation of said semiconductor regions comprises silicon nitride.

17. A method as defined in claim 1, wherein the semiconductor body used comprises silicon.

18. A method of making a transistor comprising the steps of: diffusing internested base and emitter regions into a semiconductor body having the conductivity of a collector region, so as to lie at one surface of said semiconductor body, removing a first insulating layer formed during the diffusion process from said one surface of said semiconductor body at least from said base and emitter regions up to adjacent the outermost edge of said base region, applying a coherent metal layer directly to at least the exposed portion of said one surface of said semiconductor body to cover same, making base and emitter electrodes from said coherent metal layer, applying a second insulating layer to said one surface of said semiconductor body, and making electrically conducting connections with said base and emitter electrodes through said second insulating layer by means of electrical leads.

* * * * *